United States Patent [19]

Dines et al.

[11] Patent Number: 4,535,535

[45] Date of Patent: Aug. 20, 1985

[54] METHODS AND APPARATUS FOR ASSEMBLING PERMUTATIONS OF ELEMENTS INTO OR ONTO ARTICLES

[75] Inventors: David R. Dines, Oklahoma City, Okla.; George Svoboda, Sun City West, Ariz.; Robert G. Workman, Yukon City, Okla.

[73] Assignee: AT&T Technologies, Inc., New York, N.Y.

[21] Appl. No.: 523,222

[22] Filed: Aug. 15, 1983

[51] Int. Cl.3 .......................... H05K 3/00; B23P 19/00

[52] U.S. Cl. .......................................... 29/845; 29/742; 29/745; 227/99

[58] Field of Search ................. 29/884, 892, 844, 845, 29/742, 783, 784, 791, 794, 749; 227/99, 103, 104

[56] References Cited

U.S. PATENT DOCUMENTS

| | | | |
|---|---|---|---|
| 3,017,690 | 1/1962 | Kalish | 29/742 X |
| 3,737,998 | 6/1973 | Byrd . | |
| 3,864,896 | 2/1975 | Bailey, Jr. . | |
| 3,864,897 | 2/1975 | Hitchcock . | |
| 4,102,043 | 7/1978 | Andrade et al. | 29/739 |
| 4,197,637 | 4/1980 | Honda | 29/784 X |
| 4,203,698 | 5/1980 | Du Puis | 29/739 X |
| 4,209,898 | 7/1980 | Aoki et al. . | |
| 4,264,202 | 4/1981 | Gugliotta et al. . | |

*Primary Examiner*—Mark Rosenbaum
*Assistant Examiner*—Carl J. Arbes
*Attorney, Agent, or Firm*—R. P. Miller; M. de Picciotto

[57] ABSTRACT

Various permutations of plugs (13) are inserted in keying holes (12) formed in a connector 10 secured to an edge of a printed circuit board (11). A carrier nest (16) is loaded with a permutation array of plugs (13) at a load station (20), advanced to an insert station where the array is checked, and then advanced to an unload station (22) where a group of insert pins act through carrier nest holes (17) to seat the plugs in the connector holes (12). At the inspect station, checks are made for missing plugs and plugs in wrong holes. If plugs in wrong holes are detected, the plugs are dumped from the carrier nest and a new array of plugs are loaded into the carrier nest (16). If a missing plug is detected, the carrier nest is returned to the load station and a plug is loaded into the proper nest hole (17).

18 Claims, 14 Drawing Figures

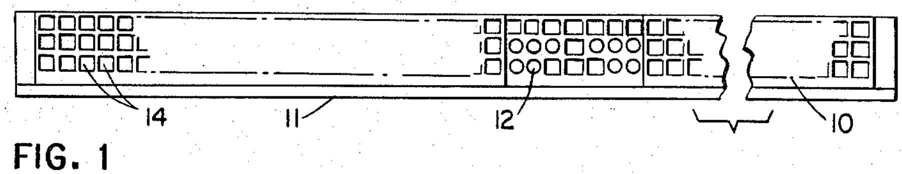
FIG. 1
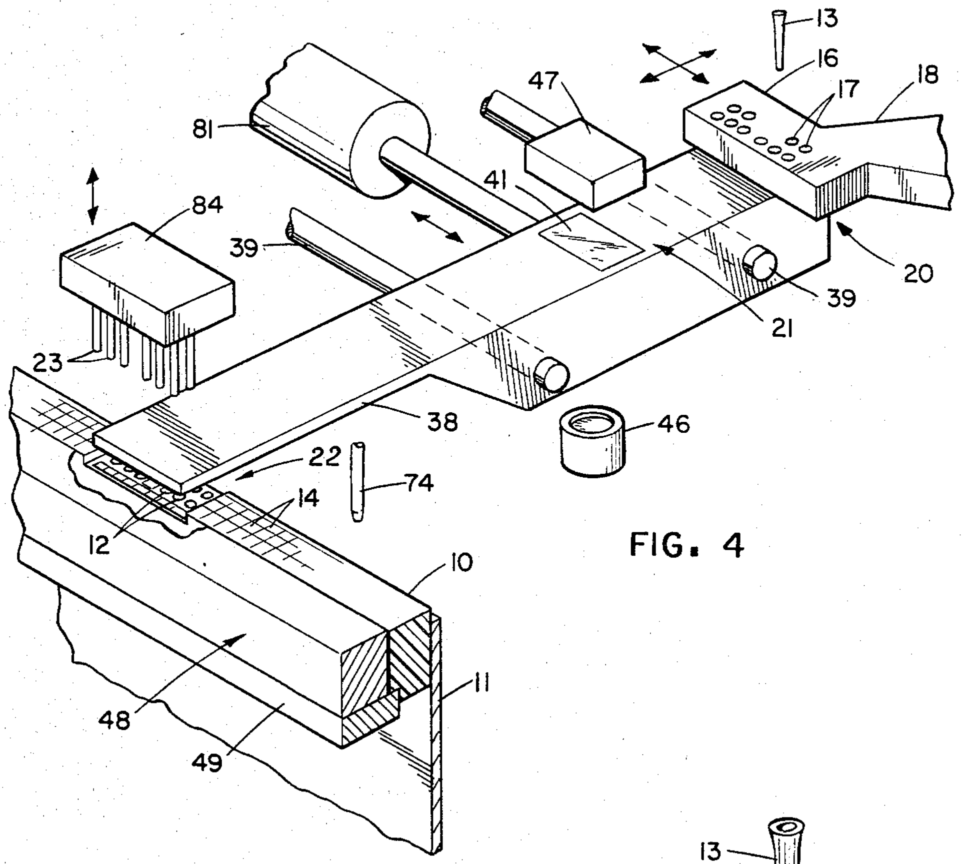
FIG. 4
FIG. 3
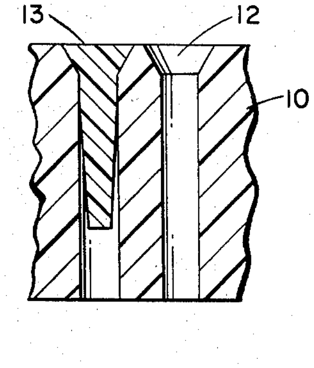
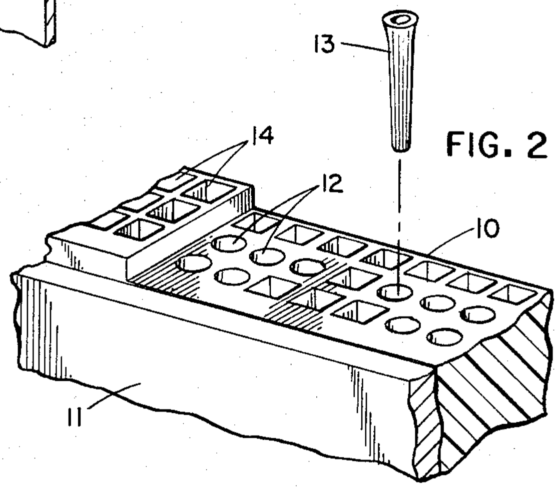
FIG. 2

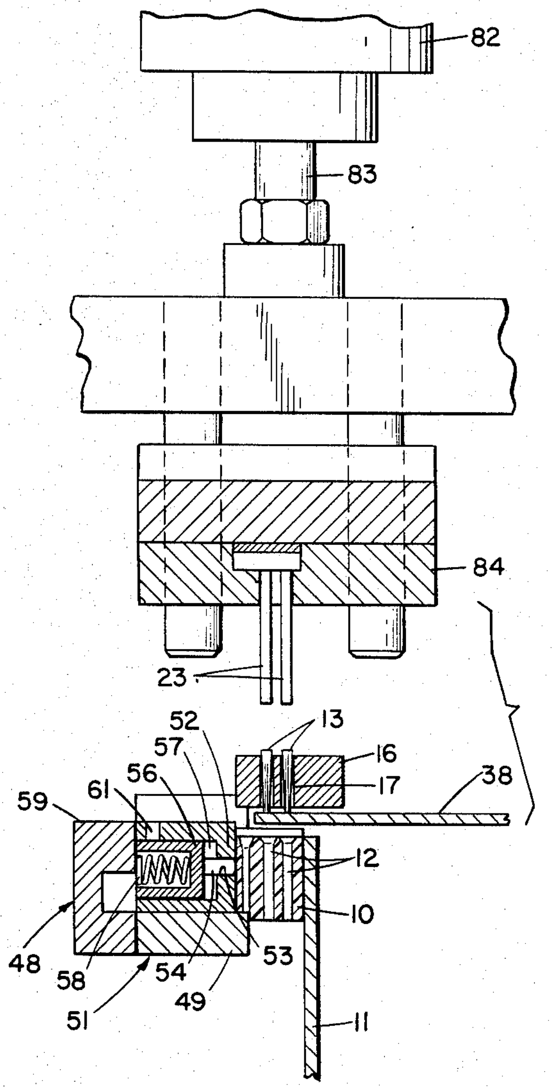
FIG. 7
FIG. 8
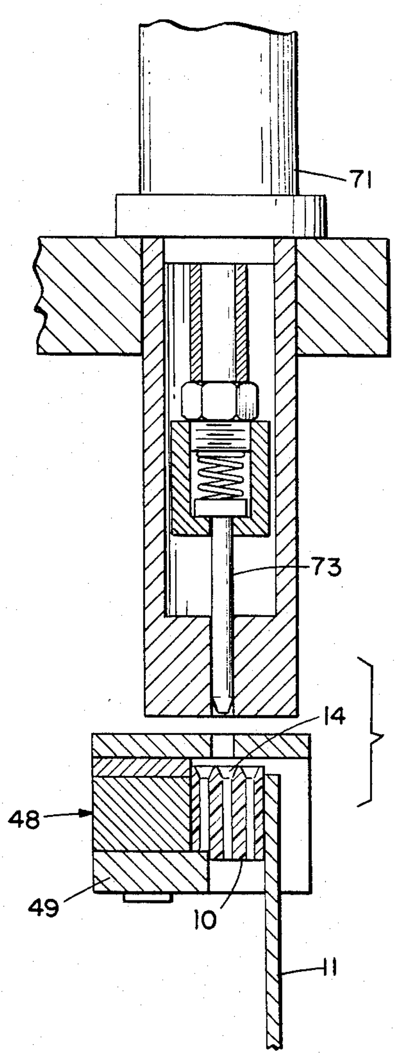

METHODS AND APPARATUS FOR ASSEMBLING PERMUTATIONS OF ELEMENTS INTO OR ONTO ARTICLES

FIELD OF THE INVENTION

This invention relates to methods and apparatus for inserting various permutations of elements into fixed arrays of apertures formed in articles, and more particularly, to methods and apparatus for disposing plugs in a predetermined order, inspecting the order of plugs, and then inserting a correct order of plugs into an array of holes formed in a connector.

BACKGROUND OF THE INVENTION

In the assembling of components to produce an article of manufacture, there is often a requirement that various permutations of first elements be assembled on or in a base or second element. One such article of manufacture is a printed circuit board with an edge connector that receives terminals extending from so-called back plane connectors mounted on telephone switch frames. The various circuit boards contain different patterns of circuit paths and different assemblages of diverse components. In order to provide a means for correctly installing the circuit boards on the appropriate back plane connectors, the circuit board edge connectors are keyed with permutations of plugged holes which restrict the installation of each keyed connector on a discrete complementary set of studs projecting from a particular back plane connector.

One application of the present invention encompasses methods and means for automatically installing various permutations of keying plugs in arrays of holes formed in successive printed circuit board edge connectors. Other applications of the invention contemplate the assembling of other elements such as pin terminals in various permutations of holes formed in a circuit component such as a circuit board or chassis.

SUMMARY OF THE INVENTION

This invention contemplates among other things, methods and apparatus for assembling different permutations of first elements onto or into second elements constituting part of a base article wherein each permutation of first elements is loaded into a transfer carrier, inspected as to proper loading, and advanced to position the first elements in register with the second elements, whereafter pushing elements are operated to assemble the first elements into or onto the second elements. While the assembled article is being removed and replaced with another base article, facilities are rendered effective to load a new permutation of elements in the carrier and complete the inspection of the new permutation of first elements.

More particularly, in one application of the invention, a permutation of plugs is assembled at a load station into holes formed to extend through the carrier. The carrier is advanced along a plug retainer plate to an inspect station whereat photodetectors are utilized to detect (1) missing plugs and (2) plugs loaded into wrong carrier holes. If one or more plugs are detected as being missing, the carrier is returned to the load station and additional plugs are inserted in the carrier holes that should have received plugs during the initial loading operation. If plugs are detected in wrong holes, the carrier is shifted relative to the retainer plate to discharge all the plugs from the carrier. Next, the carrier is shifted back onto the retainer plate and returned to the load station whereupon a new group of plugs are loaded in accordance with the desired permutation. Upon completion of each loading operation, the carrier again advances the permutation of plugs into the inspect station and if the inspection reveals a correct loading of the plugs, the carrier moves the plugs into register with holes formed in the article. At this time, the plug retainer plate is shifted relative to the carrier to drop the load of plugs towards the holes in the article. Finally a ram moves an array of insert pins towards the deposited plugs to seat the plugs in the connectors holes.

BRIEF DESCRIPTION OF THE DRAWINGS

Other features and advantages of the invention will be apparent upon consideration of the following detailed description when considered in conjunction with the drawing wherein:

FIG. 1 is a top plan view of a connector having keying holes that are to be filled with a permutation of plugs;

FIG. 2 is a partial perspective view of the connector showing a plug about to be inserted in a connector keying hole;

FIG. 3 is a partial sectional view showing a plug inserted in a connector hole;

FIG. 4 is a schematic perspective view of certain of the more significant mechanisms included in a plug permutation insertion apparatus incorporating the principles of the present invention;

FIG. 7 is a sectional view taken along line 7—7 of FIG. 6 showing the mechanism for inserting the plugs as well as a mechanism for sensing the presence of a connector in proper position to receive the plugs;

FIG. 8 is a sectional view taken along line 8—8 of FIG. 6 showing a shot pin arrangement for precisely locating and locking a connector in proper position in the apparatus;

DETAILED DESCRIPTION

Figure 5:
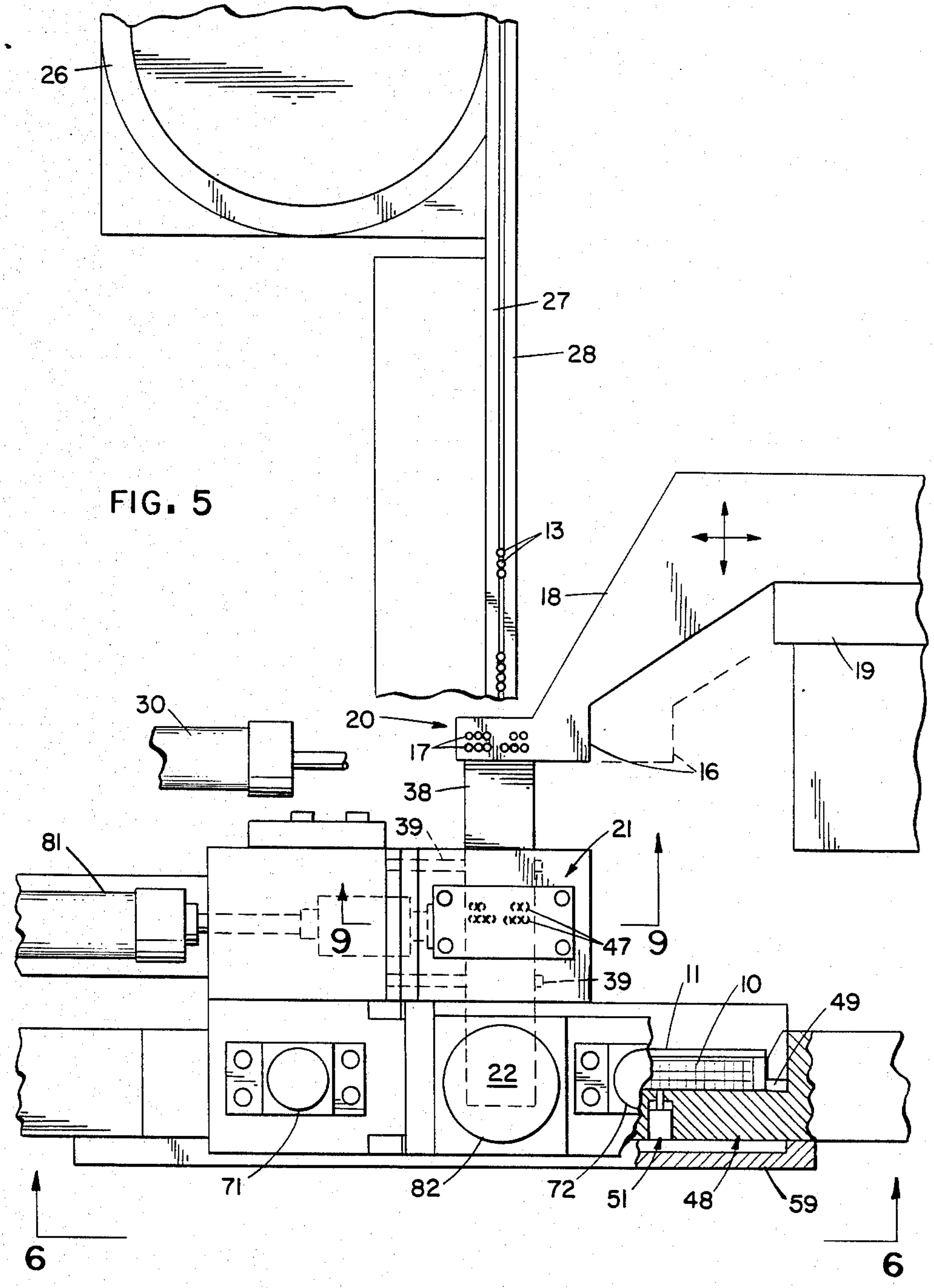
FIG. 5 is a plan view partially cut away of the plug insertion apparatus.
Figure 6:
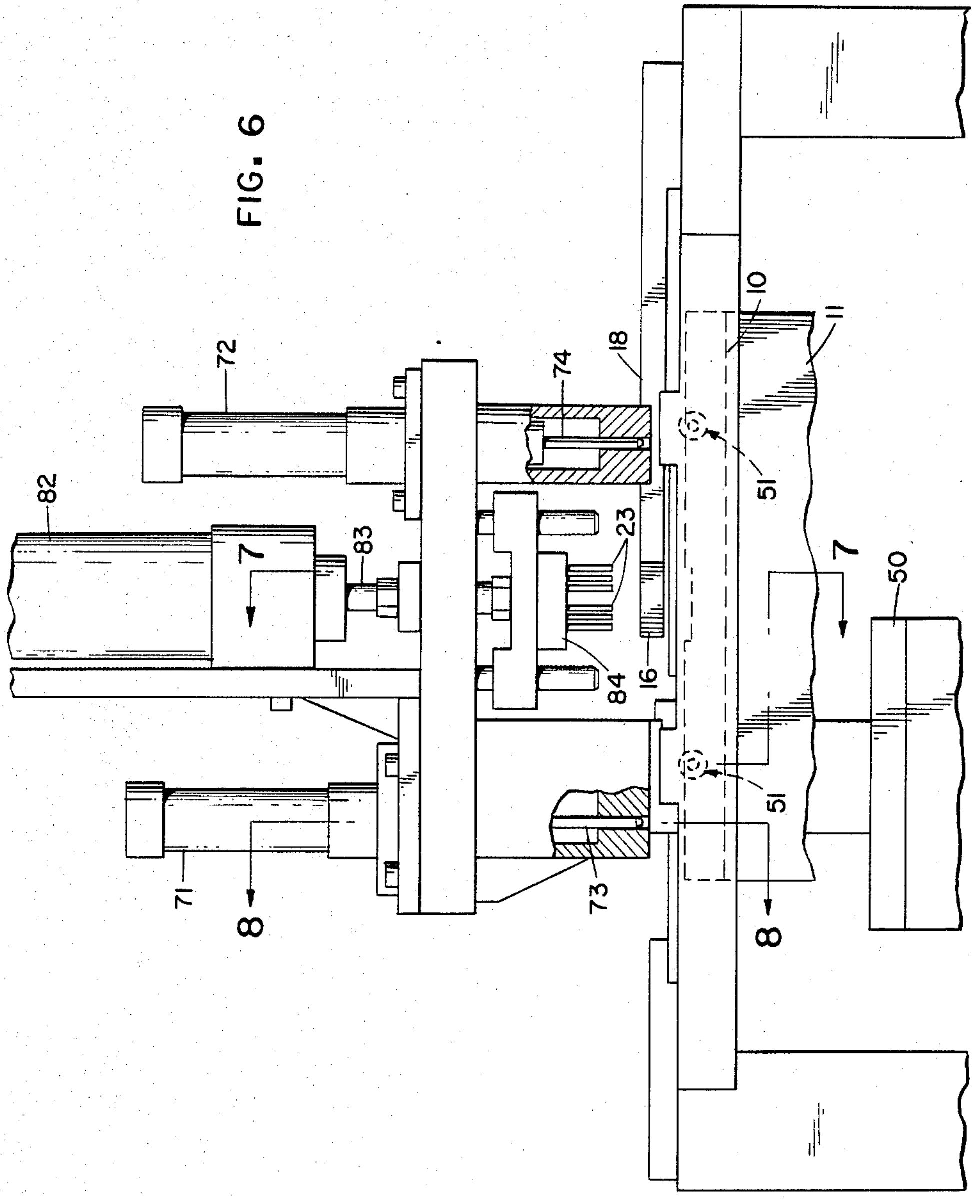
FIG. 6 is a front elevational view of the plug insertion apparatus shown in FIG. 5.
Figure 9:
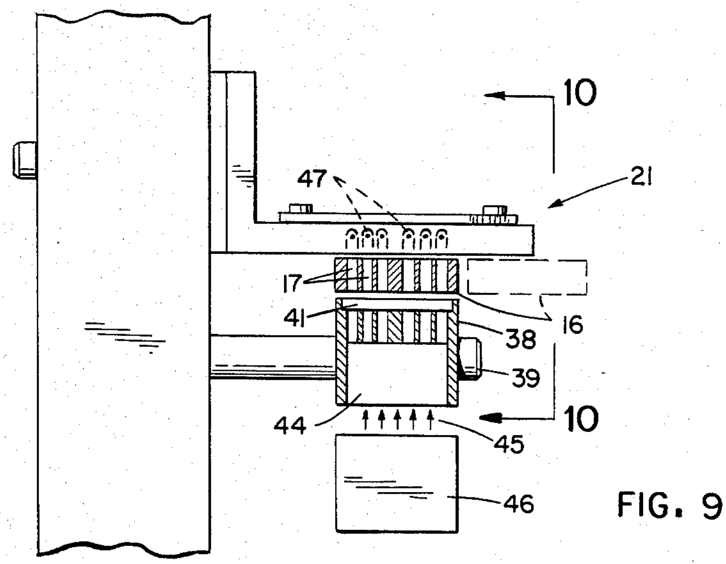
FIG. 9 is a sectional view taken along line 9—9 of FIG. 5 showing the details of the facilities utilized to check the loading of the desired permutation of plugs in a transfer carrier.
Figure 10:
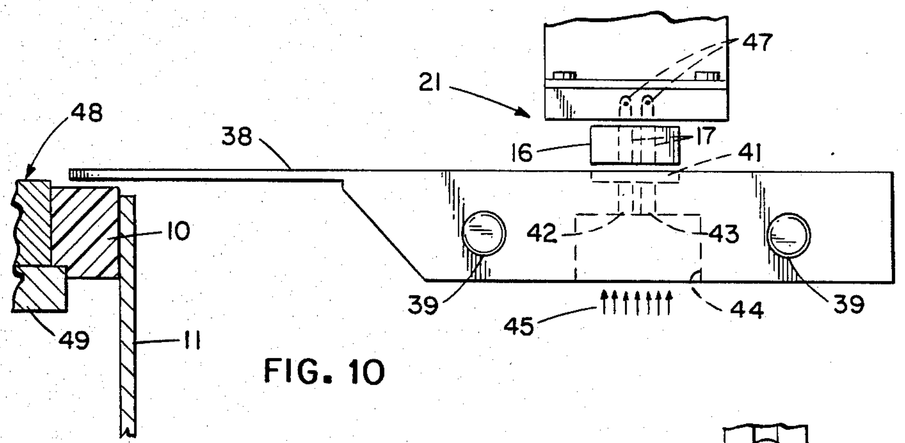
FIG. 10 is a side view taken along line 10—10 of FIG. 9 showing a plate for supporting the plugs loaded in the transfer carrier.

Referring to FIGS. 1, 2, and 3, there is shown an edge connector 10 that is mounted on a printed circuit board 11. At the center of the connector there is an array of ten round holes 12 into which are to be inserted various permutations of five headed plastic plugs 13. The connector is also provided with two arrays of square entry holes 14.

In use of the connector, the plugged holes serve as keying means for ensuring that the connector can only be assembled on a connector having an array of projecting key studs which correspond with the permutation of unplugged holes 12.

Referring to FIG. 4, there is disclosed a carrier nest or slide 16 having an array of holes 17 corresponding to an array of holes 12 formed in the connector. The carrier nest 16 is mounted on an arm 18 connected to a slide 19 (see FIG. 5) mounted for movement in X-Y directions. Any number of commercial X-Y drive mechanisms may be used to move the nest into various positions at a load station 20 to receive a predetermined permutation of five plugs 13 in the nest holes 17. The overall machine may be controlled by a programmed controller such as an "Anomatic" controller, manufactured by the Anorad Corporation, Hauppauge, N.Y. The nest 16 when loaded with five plugs is transferred to an inspect station 21 where the presence of the plugs is checked. If a proper permutation of plugs is ascertained, the nest is transferred to an unload station 22 where the plugs are pushed from the nest by a bank of insertion or pusher pins 23 and inserted into the desired permutation of holes 12 in the connector 10.

If, at the inspect station, an improper permutation of loaded plugs is ascertained, the X-Y drive is operated to shift the nest 16 to discharge the loaded plugs into a suitable receptacle whereafter the nest is returned to the load station 20. The X-Y drive is then operated to again selectively position the nest to receive an array of plugs in accordance with the desired permutation. The array of loaded plugs are again inspected at the inspect station and if a satisfactory loading is determined, the nest is advanced to the unload station 22 where the pusher pins 23 transfer and insert the plugs into the proper permutation of holes in the connector.

If, however, a missing plug is ascertained at the inspect station 21, the X-Y drive functions to return the nest to the load station 20. The X-Y drive moves the nest to position the empty hole in the nest to receive a plug. The inspection is again carried out, and if a proper array of plugs are detected, the nest is advanced to the unload station 22.

Load Station

Figure 11:
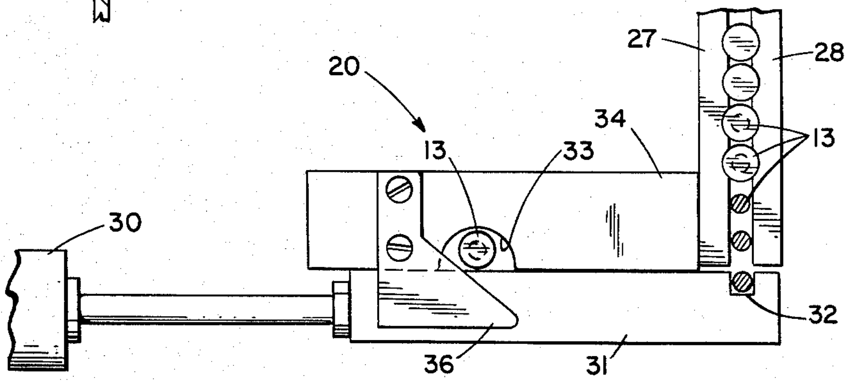
FIG. 11 is a top view of a mechanism for feeding plugs emanating from a vibratory hopper into holes formed in the transfer carrier.

At the load station 20, plugs 13 are advanced from a vibratory bowl 26 (see FIGS. 5 and 11) along a pair of rails 27 and 28 with the plug heads overlaying the rails to a loading or escapement mechanism. The details of the loading mechanism are not shown in the assembly drawing FIG. 5, but are shown in FIG. 11. The loading or escapement mechanism includes an air cylinder 30 that is cyclically operated to reciprocate a transfer bar 31 having a square notch 32 which is cyclically positioned to receive the shank of each headed plug to move each successive plug 12 into lateral alignment with a passageway 33 formed in a guide gib 34. As the bar moves the plug, a wiper 36 acts to engage the head of the plug and push the plug into the passageway 33 which is aligned with a positioned hole 17 in the carrier nest. The X-Y drive is program controlled to move the nest prior to each operation of the air cylinder 30, so that a predetermined permutation of nest holes 17 are postioned and loaded with plugs.

Inspect Station

The carrier nest 16 loaded with a permutation of plugs is advanced by the X-Y drive to the inspect station 21 (see FIGS. 4, 5, 9 and 10). The holes 17 in the nest 16 are larger than the heads of the plugs 13 and the plugs would normally fall through the nest holes; however, a retainer or support bar 38 slideably mounted on guide rods 39 is positioned beneath the path of movement of the nest so that the plugs are retained in the nest during movement to the inspect station 21 and also during movement from the inspect station to the unload station 22. As shown in these figures, the retainer bar 38 has a glass insert 41 at the inspect station which overlays two rows of bores 42 and 43 that run to a cavity 44. The bores 42 and 43 are arrayed in a manner similar to the arrays of holes 17 and 12 formed in the carrier nest 16 and the connector 10.

When the carrier nest moves the permutation of plugs to the inspect station, a light beam 45 from a source 46 is projected through the cavity 44, the bores 42 and 43, and the glass insert 41 to impinge light on the underside of the nest 16. An array of ten light detectors 47 located above the nest 16 sense the pattern of light projected through the nest holes 17 and detect the holes that are not loaded with plugs. If the sensed pattern of light beams is in accordance with the proper loading of plugs into the nest holes, a signal is generated to actuate the X-Y drive to move the nest to the unload station 22.

If, at the inspect station, the light sensors determine that a plug 13 is loaded into a nest hole 17 that is not in accordance with the programmed permutation of holes to be loaded, a signal is generated and the X-Y drive is operated to shift the nest 16 to the right as viewed in FIGS. 4 and 5 so that the nest moves from overlaying relation with respect to the retainer bar 38. Inasmuch as the plugs are supported in the nest by the retainer bar, the plugs now drop from the nest into a discharge chute (not shown). The now empty nest is returned to the position overlying the retainer bar 38 and then moved back to the load station 20 where another plug loading cycle is executed. Following the reloading of the permutation of plugs, the nest is again moved to the inspect station.

If, however, the light detector senses that one or more plugs are missing from the desired pattern, a signal is generated to operate the X-Y drive to return the nest to the load station 20. The X-Y drive and the plug loading air cylinder 30 are cyclically operated in concordance to load plugs into vacant holes that should have been loaded during the first loading operation. Following the loading of the missing plugs, the nest is again advanced to the inspect station for a check as to the proper loading of the permutation of plugs.

Following each determination of a properly loaded nest at the inspect station 21, the carrier nest 16 is advanced to the unload station 22 in register with a connector 10 secured in a holding fixture 48 (see FIGS. 4, 5, 6, 7 and 8).

Unload Station

Prior to an execution of a cycle of operation of the machine, an attending operator places a connector 10 in a holding fixture 48 which is shaped to accommodate the connector. The holding fixture includes a ledge 49 on which the connector seats and against which the printed circuit board 11 rests.

Referring to FIG. 7, there is shown one of a pair of connector presence sensors 51 (see also FIG. 6) each of which is mounted in a back plate 52 of the fixture 48 and which includes a first bore 53 through which extends a first sensor pin 54. The sensor pin 54 is formed integral with a hollow cylinder 56 slideably mounted in a cavity 57 formed in the back plate 52. A spring 58 normally urges the cylinder to move the pin 54 into the fixture nest to detect the presence of a connector 10. Mounted on the back of the plate 52 is a manifold 59 for applying air pressure into the hollow cylinder 56. When a connector 10 is not positioned in the fixture, the cylinder 56 is in a forward position and uncovers a hole 61 to allow air to escape from the manifold into the cavity 57 and through the hole 61 to the atmosphere. When a connector 10 is placed in the fixture, the pin 54 is moved to the left to move the cylinder 57 into position to block the hole 61. The air pressure in the manifold is monitored and when a predetermined back pressure is sensed, indicative of a connector 10 in the fixture depressing both sensors 51, a detector (not shown) is operated to generate a signal which controls the operation of a pair of air cylinders 71 and 72. When operated, the air cylinders drive a pair of pistons to move a pair of spring loaded alignment lock pins 73 and 74 (see also FIG. 6) downwardly into a pair of the spaced square holes 14 formed in the connector. The connector is now held in the fixture in a position to receive the plugs.

The seating of both lock pins 73 and 74 is followed by the generation of a further signal that is effective to initiate the programmed controller to execute the commands necessary to commence the unloading of plugs from the carrier nest and the insertion of the plugs into the connector holes 12. If available, the carrier nest 16, loaded with a correct permutation of plugs, is advanced along the support bar 38 to the unload station 22. At this time, a connector 10 is detected by sensors 51 as being properly positioned in the holding fixture 48, and the alignment pins 73 and 74 are in the down position, a further signal is produced by the controller to operate an air cylinder 81 (see FIGS. 4 and 5) which functions to shift the retainer bar 38 to the left to allow the permutation of plugs 13 to drop through the carrier nest holes 17 onto the entries to the connector holes 12 in the connector. The programmed controller then generates a signal to operate an air cylinder 82 (see FIG. 6) to drive a piston rod 83 downward. The piston rod 83 is secured to a mounting 84 for the pusher pins 23, and thus, the pusher pins move through the nest holes 17 and the permutation of plugs 13 is driven and seated in the desired array of connector holes 12. Next, the pusher pin air cylinder 82 and the retainer bar air cylinder 81 are reversed, and finally the alignment pin air cylinders 71 and 72 are reversed by actuation of an operator controlled foot switch, thus placing the overall machine in condition for the next cycle of operation.

During the time that the attending operator is removing a plugged connector 10 from the holding fixture 48 and positioning a new connector in the fixture, the facilities at the plug load station 20 and at the inspect station 21 are operated, so that the carrier nest 16 is loaded with the next permutation of plugs and is ready to be advanced into the unload station 22.

Programmed Controller

Figure 12:
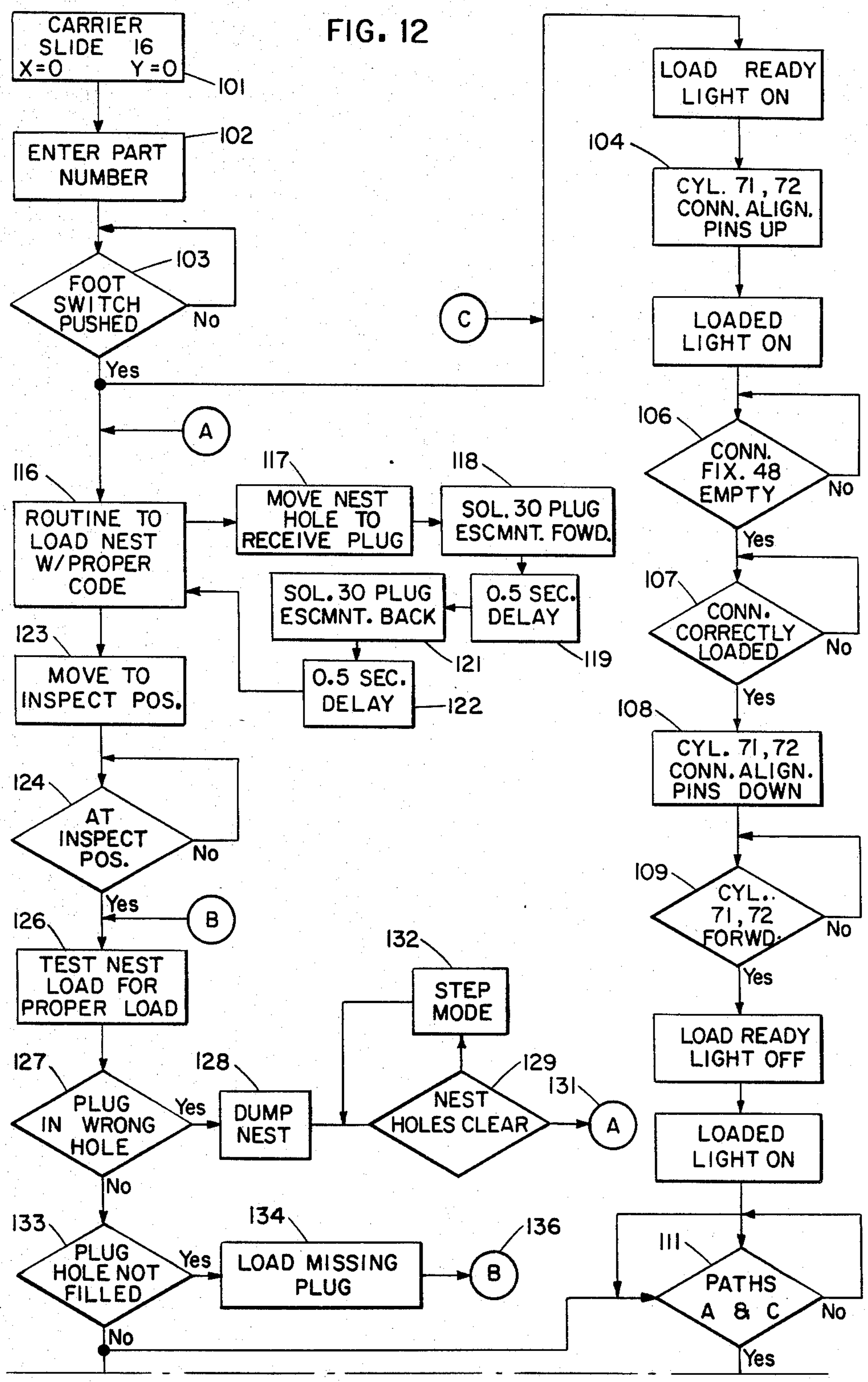
FIGS. 12 and 13 when assembled as depicted in FIG. 14 is a flow chart illustrating the programmed sequence of the operations executed by the apparatus in assembling permutative arrays of plugs into a connector.
Figures 12, 13, 14:
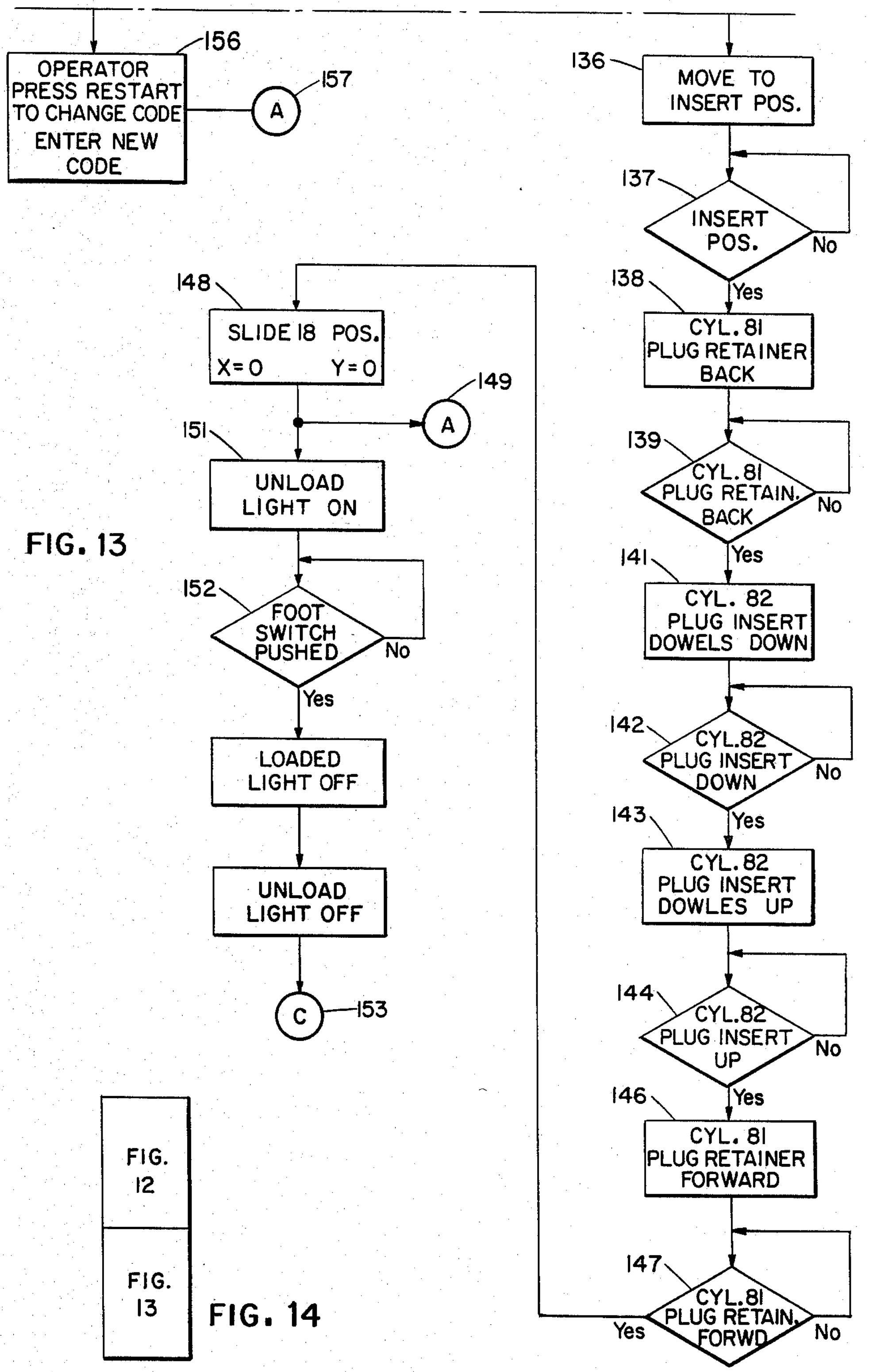

Prior to a consideration of the programmed controller flow chart disclosed in FIGS. 12 and 13, it should be understood that each of the air cylinders are provided with commercial solenoid control valves to move the pistons to forward and to withdrawn positions. In addition, pairs of limit switches or other commercial sensors are associated with the pistons or the components moved by the pistons to provide indications and signals representative of either forward or withdrawn positions of the pistons or the components moved by the pistons.

In execution of the program as illustrated in FIGS. 12 and 13, the controller initially sets the carrier nest 16 in an initial home position (block 101). An attending operator ascertains the connector code number which is indicative of the permutation of plugs to be inserted in a particular connector or a run of connectors. This code is entered (block 102) in the controller. A foot switch (block 103) is operated to initiate two sequence paths, A and C.

Considering path C, control signals (block 104) are impressed to ensure that air cylinders 71 and 72 are conditioned to move or maintain the alignment pins 73 and 74 to or in the up position. At this time, the connector sensors 51 (block 106) are indicating that the connector holding fixture 48 is empty. The attending operator places a connector 10 in the holding fixture and when the sensors 51 ascertain a properly positioned connector (block 107), signals are sent to operate the air cylinders 71 and 72 (block 108) to drive the alignment pin 73 and 74 downwardly (block 109) to engage in a pair of spaced square holes 14 in the connector to lock the connector in position. The seating of the alignment pins is accompanied by the impressing of a first conditioning signal on a first input of a decision circuit (block 111).

As soon as the foot switch (block 103) is operated, controls through path A are initiated to commence the movement of the carrier nest 16 in accordance with the coded routines (block 116). The nest is moved relative to a load position at the load station 20 (block 117) to receive the plugs. More specifically, the solenoid controlled air cylinder 30 is operated (block 118) to position the plug transfer escapement bar 31 to receive a plug 13. After a delay (block 119), the air cylinder 30 moves (block 121) the transfer bar 31 to effectuate the deposit of a plug in the positioned carrier nest hole 17. After another delay (block 122), the next loading cycle commences. The loading facilities are cyclically operated in accordance with the coded input until five plugs have been deposited in a permutation of holes 17 in the carrier nest. The loaded carrier nest moves (block 123) to the test station 21 (block 124). The test for the proper seating of the plugs in the carrier nest is initiated (126).

The first test (block 127) is for a plug in a hole which is not in accordance with the permutation established by the entered code (block 102). If the test indicates a plug in a wrong hole, the carrier nest 16 is moved relative to the retainer bar 38 to dump (block 128) all plugs from the nest. The carrier nest is returned to the inspect position 21 and determination (block 129) is made to ensure that the nest is clear. The carrier nest is returned to the initial load position 20 and path A (block 131) is again established to reload the nest. If for some reason the inspect station indicates that the nest holes are not clear, the controller initiates a step mode of operation (block 132). At this time, the operator can initiate a manual control of the movement of the carrier nest. The nest is moved from a position overlaying the retainer bar so that the operator may examine the carrier nest and push the plugs from the nest. This step mode of operation will be continued until the inspect station 21 determines (block 129) that the nest holes are clear, whereupon the control path a (block 131) is again initiated.

When the test (block 127) indicates that there are no plugs in wrong holes, the carrier nest is subjected to a second test (block 133) to determine whether or not any of the holes in accordance with the predetermined permutation are not loaded with a plug. If a determination is made that one or more plugs are missing, the carrier nest is returned (block 134) to the load station 20 and the X-Y drive is operated to position the appropriate carrier hole 17 to receive a plug. Following the loading of the missing plug in the hole, a subroutine path B (block 136) is completed so that the nest is again moved into the inspect station 21 for the plug in wrong hole test (block 127) and the plug missing test (block 133). Upon the test station 21 ascertaining a properly loaded permutation of plugs, a signal is generated and impressed on a second input to decision circuit (block 111).

Upon decision circuit (block 111) receiving inputs from path A and path C, an output signal is impressed on the X-Y drive to move (block 136) the carrier nest 17 to the insert position 22. With the carrier in the insert position, a signal is generated (block 137) to operate air cylinder 81 to pull (block 138) the retainer bar 38 back from beneath the carrier nest 16, whereupon the plugs 13 drop toward the holes 12 in the connector 10. When the retainer bar 38 is pulled back a signal is generated (block 139) to operate (block 141) air cylinder 82 which drives the insert pins or dowels 23 downwardly to seat the plugs 13 in the holes 12. The downward movement of the insert pins is followed by the generation (block 142) of a signal to reverse the operation of the air cylinder 82 to withdraw (block 143) the insert pins. The withdrawal of the insert pins is followed by the generation (block 144) of a control signal which is impressed to operate (block 146) air cylinder 81 to move the retainer bar 38 back under the carrier nest 16. The completion of the restoration of the retainer bar 38 is accompanied by the generation (block 147) of a signal to return (block 148) the carrier nest 16 to the original home position in anticipation of the next loading of a permutation plugs into the carrier nest. The return of the nest to the home position is followed by the generation (block 149) of a signal to recommence the loading of the nest with the next permutation of plugs. In other words, control path A is reestablished and the loading of the next permutation of plugs in the carrier nest is carried out while the attending operator is unloading the key plugged connector 10 and loading an empty connector in the nest.

At this time, an unload light (block 151) comes on to indicate to the operator that the plug loaded connector may be removed from the holding fixture. The attending operator commences an unloading operation by first operating (block 152) the foot switch to complete (block 153) path C. This is accompanied by an operation of the air cylinders 71 and 72 (block 104) to move the alignment pins 73 and 74 from the connector. Now, the operator can remove the key plugged connector and load the next connector in the empty holding fixture and the next loading cycle is initiated (block 107).

To change codes, the attending operator presses (block 156) a push button which permits the operator to enter the new code and recommence (block 157) the nest loading and inspection cycle. A console (not shown) may be provided with appropriate lights to apprise the operator of the operating conditions of the various mechanisms. These particular lights are shown and identified on the flow chart.

What is claimed is:

1. An apparatus for positioning a number of elements arranged in various first predetermined arrays on articles at element receiving sites which are in an array large enough to encompass the various arrays of elements, which comprises:

a plurality of work stations including a load station, an unload station, and an inspect station located between the load and unload stations;

a fixture located at the unload station for holding an article having the array of receiving sites;

means proximate to the load station for feeding a succession of elements into a load position at said load station;

a carrier selectively movable relative to the plurality of work stations having an array of element receiving holes corresponding to the array of element receiving sites on the article; an elongated bar longitudinally extending between the load station and the unload station and slidably positioned beneath said carrier for supporting the elements in said carrier receiving holes;

means including a programmed controller for moving the carrier relative to the load position to receive in said receiving holes a predetermined array of elements from said feeding means;

means located at the inspect station for sensing the array of elements loaded into the carrier to determine if the array of received elements is in accordance with the predetermined array and for generating one out-of-three different control signals; the controller operating said moving means (i) to advance the carrier from the inspect station to overlay said fixture in response to a first control signal of said three different signals, or (ii) to return the carrier from the inspect station to the load station in response to a second control signal of said three different signals, or (iii) to shift the carrier out of the inspect station in response to the third control signal of said three different signals; and means located at the unload station rendered effective upon said carrier being advanced to overlay the fixture for transferring the array of elements from the carrier receiving holes to the element receiving sites on the article held in the fixture.

2. An apparatus for loading a predetermined array of pins into a bank of holes formed in an article, which comprises:

a load station, an unload station, and an inspect station positioned therebetween;

a fixture located at the unload station for holding an article;

a carrier selectively movable relative to the station having an array of pin receiving holes corresponding to the bank of holes formed in the article; an elongated bar longitudinally extending between the load station and the unload station and slidably positioned beneath said carrier for supporting the pins in said carrier receiving holes;

means proximate to the load station for feeding a succession of pins into a load position at the load station;

means operatively associated with the plurality of work stations including a programmed controller for moving the carrier relative to the load position to receive in said receiving holes a predetermined array of pins from said feeding means;

means located at the inspect station for sensing the array of pins loaded into the carrier to determine if the array of received pins is in accordance with the predetermined array and accordingly generating a control signal out of a plurality of different control signals, the controller operating said moving means (i) to advance the carrier to the unload station in response to a first control signal, or (ii) to return the carrier to the load station in response to a second control signal, or (iii) to shift the carrier out of the inspect station in response to a third control signal; and means located at the unload station rendered effective upon said carrier being moved to the unload station to overlay the fixture for transferring the array of pins from said carrier receiving holes into the bank of holes formed in an article held in said fixture.

3. An apparatus as defined in claim 2, which includes:

means coupled to the bar and rendered effective upon said carrier being moved to overlay said fixture for transversally sliding said bar to drop the pins into the bank of holes in the article held in the fixture.

4. An apparatus as defined in claim 3, which includes:

means located at the unload station including a plurality of insertion dowels corresponding to the number of carrier holes for seating the pins dropped from said carrier holes into the bank of article holes; and means located proximate to said seating means which is rendered effective upon the transversal movement of said bar from beneath said carrier for operating said seating means.

5. An apparatus as defined in claim 2, which includes:

means responsive to the second control signal generated by said sensing means, indicative of a pin missing from said array of pins loaded in said carrier holes, for returning said carrier to said load position to receive a pin in the carrier hole determined to have a pin missing.

6. An apparatus as defined in claim 2, which includes:

means responsive to the third control signal generated by said sensing means, indicative of the presence of a pin in a carrier hole that is not in accordance with the predetermined array, for shifting said carrier relative to said bar to drop all the pins from said carrier; and means for returning said carrier to said load position to receive a new array of pins.

7. An apparatus as defined in claim 2, which includes:

means operatively associated with said carrier which is rendered effective upon transfer of the array of pins from said carrier holes to said bank of holes for recycling said carrier to load and inspect another array of pins while said fixture is being unloaded and loaded with another article.

8. An apparatus as defined in claim 2, which includes:

means located in the fixture for detecting the presence of an article to be loaded;

locking means operatively associated with and responsive to the detecting means for holding the article in position in the fixture; and means operatively associated with and responsive to the locking means for controlling the operation of said pin transferring means.

9. An apparatus for assembling a predetermined permutation of plugs into an array of receiving holes formed in an article, which comprises:

three successively located work stations including a load station, an inspect station and an insertion station;

a carrier selectively movable relative to the work stations having an array of holes corresponding to the array of holes formed in the article;

means at the load station for loading plugs into the carrier holes in accordance with the predetermined permutation;

a support plate extending between the load station and the insertion station and located beneath the carrier for covering the bottoms of said carrier holes and supporting the plugs loaded thereinto during movement of the carrier relative to the work stations;

means operatively associated with the carrier for moving the carrier along the plate to the inspect station and then to the insertion station;

means at the inspect station for ascertaining that the loaded plugs in the carrier are in accordance with the predetermined permutation;

means rendered effective by said ascertaining means for operating the moving means to advance the carrier to the insertion station to position the plugs in alignment with the holes in the article; and means operative upon advancement of the carrier into the insertion station for shifting the support plate relative to the carrier to drop the permutation of plugs into the holes formed in the article.

10. An apparatus as defined in claim 9 which includes:

means operatively associated with the carrier which is responsive to the detection of a missing plug in one of the carrier holes at the inspect station for returning the carrier to the load station;

means operatively associated with the plug loading means which is rendered effective upon return of the carrier to the load station for operating the plug loading means to load the missing plug; and means operatively associated with the carrier moving means which is rendered effective upon loading of the missing plug for operating the carrier moving means to advance the carrier to the inspect station and then to the insertion station.

11. An apparatus as defined in claim 9 which includes:

means operatively associated with the carrier which is responsive to the detection of a plug present in one of the carrier holes not in accordance with the predetermined permutation for shifting the carrier away from the plate to drop all the plugs loaded into the carrier and repositioning the carrier above the plate;

means operatively associated with the carrier which is rendered effective upon the repositioning of the carrier above the plate for returning the carrier to the load station; and means for operating the loading means to load a new array of plugs into the carrier.

12. A method for inserting a predetermined permutation of plugs in an array of holes formed in an article, which comprises:

loading a permutation of plugs in a transfer carrier, at a load station;

moving the transfer carrier to an inspect station;

ascertaining at the inspect station the permutation of plugs loaded in the transfer carrier;

advancing the transfer carrier to an insert station only upon ascertaining the presence of the predetermined permutation of plugs; and inserting the permutation of plugs advanced to the insert station into the array of holes in an article positioned in the insert station.

13. A method as defined in claim 12, which comprises prior to the carrier advancing step the steps of:

sensing the absence of plugs in the permutation at the inspect station;

returning the transfer carrier to the load station upon sensing one or more missing plugs from the permutation;

loading the transfer carrier with additional plugs in accordance with the sensing of the absence of plugs; and returning the transfer carrier to the inspect station.

14. A method as defined in claim 12 which comprises prior to the carrier advancing step the steps of:

sensing the presence of plugs which are not arranged in accordance with the predetermined permutation;

removing all the plugs from the transfer carrier;

returning the transfer carrier to the load station upon removal of the plugs;

loading a new permutation of plugs into the transfer carrier; and returning the transfer carrier to the inspect station.

15. A method as defined in claim 12 wherein the plug loading step includes:

loading the permutation of plugs into holes extending through the transfer carrier;

supporting the plugs within the holes in the transfer carrier during advance to the inspect and insert stations; and removing the support for the plugs at the insert station prior to the insertion of the plugs into the holes in the article.

16. A method as defined in claim 14 wherein:

the plug loading step includes loading the permutation of plugs into holes in the carrier;

the moving and advancing steps include the step of transferring the carrier from the load station to the inspect and insert stations along a support bar positioned beneath the carrier; and the removing step comprises shifting the carrier relative to the support bar to drop all of the plugs from the carrier.

17. A method of inserting a predetermined permutation of plugs in an array of holes formed in an article comprising the steps of:

loading a permutation of plugs in a transfer carrier, at a load station;

moving the transfer carrier to an inspection station;

sensing the absence of plugs in the permutation at the inspection station;

returning the transfer carrier to the load station upon sensing one or more missing plugs from the permutation;

loading the transfer carrier with additional plugs in accordance with the sensing of the absence of plugs and returning the transfer carrier to the inspection station;

advancing the transfer carrier to an insertion station only upon ascertaining the presence of the predetermined permutation of plugs; and inserting the permutation of plugs advanced to the insertion station into the array of holes in an article positioned in the insertion station.

18. A method of inserting a predetermined permutation of plugs in an array of holes formed in an article comprising the steps of:

loading a permutation of plugs in a transfer carrier, at a load station;

moving the transfer carrier to an inspection station;

sensing the presence of plugs not arranged in accordance with the predetermined permutation;

removing all the plugs from the transfer carrier;

returning the transfer carrier to the load station upon removal of the plugs;

loading a new permutation of plugs into the transfer carrier and returning the transfer carrier to the inspection station;

advancing the transfer carrier to an insertion station only upon ascertaining the presence of the predetermined permutation of plugs; and inserting the permutation of plugs advanced to the insertion station into the array of holes in an article positioned in the insert station.

* * * * *